United States Patent
Mongardien et al.

(10) Patent No.: US 7,042,633 B2
(45) Date of Patent: May 9, 2006

(54) RAMAN AMPLIFIER AND METHOD FOR PUMPING A RAMAN AMPLIFIER

(75) Inventors: Dominique Mongardien, Antony (FR); Catherine Martinelli, Palaiseau (FR); Dominique Bayart, Clamart (FR)

(73) Assignee: Alcatel, Paris (FR)

( * ) Notice: Subject to any disclaimer, the term of this patent is extended or adjusted under 35 U.S.C. 154(b) by 159 days.

(21) Appl. No.: 10/754,496

(22) Filed: Jan. 12, 2004

(65) Prior Publication Data

US 2004/0141226 A1    Jul. 22, 2004

(30) Foreign Application Priority Data

Jan. 13, 2003    (EP)    .................................. 03360006

(51) Int. Cl.
*H01S 3/00*    (2006.01)

(52) U.S. Cl. ..................................................... 359/334
(58) Field of Classification Search .................. 359/334
See application file for complete search history.

(56) References Cited

U.S. PATENT DOCUMENTS

| | | | |
|---|---|---|---|
| 6,320,884 B1 | 11/2001 | Kerfoot, III et al. | |
| 6,384,962 B1 | 5/2002 | Foursa et al. | |
| 6,480,326 B1 * | 11/2002 | Papernyi et al. | 359/334 |
| 6,707,598 B1 * | 3/2004 | Krummrich | 359/334 |
| 2002/0101649 A1 | 8/2002 | Islam | |
| 2002/0109906 A1 | 8/2002 | Grubb et al. | |

FOREIGN PATENT DOCUMENTS

| | | | |
|---|---|---|---|
| EP | 001225666 A2 | * | 7/2002 |
| EP | 001233490 A2 | * | 8/2002 |
| WO | WO 02/07274 A2 | | 1/2002 |

* cited by examiner

*Primary Examiner*—Mark Hellner
(74) *Attorney, Agent, or Firm*—Sughrue Mion, PLLC

(57) ABSTRACT

A Raman amplifier (10) including at least one amplifying fiber (12) and a coupler (14) for coupling at least first (16) and second (18) pump laser modules to the amplifying fiber (12), the first pump laser module (16) including a frequency discriminator (24) for selecting an optical frequency to be emitted with an optical power exceeding an optical power of remaining optical frequencies that are also emitted by the first pump laser module (16). The first optical frequency is spaced apart from a local maximum (28; 36; 48) in optical power of the remaining optical frequencies, and the second pump laser module (18) emits at an optical frequency one Stokes-frequency above the frequency of the local maximum (28; 36; 48). The first optical frequency and the frequency of the local maximum are chosen on Stokes-frequency above the signal frequency range. As a consequence, the Raman gain provided in the Raman amplifying fiber 12 is broadened.

10 Claims, 2 Drawing Sheets

RAMAN AMPLIFIER AND METHOD FOR PUMPING A RAMAN AMPLIFIER

BACKGROUND OF THE INVENTION

The invention is based on a priority application EP 03 360 006.5 which is hereby incorporated by reference.

The present invention relates to a Raman amplifier comprising at least one length of Raman amplifying fiber and at least a coupler for coupling at least a first pump laser module and a second pump laser module to said Raman amplifying fiber, the first pump laser module comprising a frequency discriminator for selecting an optical frequency to be emitted with an optical power exceeding an optical power of remaining optical frequencies that are also emitted by said first pump laser module.

Further, the present invention relates to a method of pumping a Raman amplifier comprising the steps of providing at least one length of Raman amplifying fiber, coupling at least a first pump laser module and a second pump laser module to said Raman amplifying fiber and, selecting an optical frequency to be emitted by the first pump laser module with an optical power exceeding an optical power of remaining optical frequencies that are also emitted by said first pump laser module.

Such a Raman amplifier and such a method are known from U.S. Pat. No. 6,384,962 and from U.S. Pat. No. 6,320,884.

In general, Raman amplifiers are utilized for amplifying optical signals in wavelength division multiplexing (WDM) long distance optical fiber communications systems.

Light propagating in such systems is prone to attenuation. Optical amplifiers help to compensate for such attenuation by providing additional power to the optical signal as it propagates through the system.

A Raman amplifier provides for pump light that is introduced along a length of the optical fiber that guides the optical signal. The pump light wavelength is shorter than the signal wavelength. Accordingly, pump light photon energy exceeds signal photon energy. Energy is transferred from the pump light to the signal by stimulated Raman scattering. Utilizing this physical effect for signal amplification is per se known.

In a simplified depiction, pump light photons of high energy are absorbed by scattering particles such as $SiO_2$ and/or $GeO_2$ inside the fiber due to inelastic scattering processes. As a result, the scattering particles are excited, i.e. their energy is increased to a higher energy level $E_e$ as compared to the energy $E_0$ of the non-excited state. If the excited molecule does not return to its non-excited state but to an excited state of lower energy $E_1$ ($E_0<E_1<E_e$), a (first) photon of Energy $E_s$ with $E_s=E_e-E_1$ is emitted. The photon may be emitted spontaneously or the emission may be stimulated by a further (second) photon or signal photon of energy $E_s$ propagating through the fiber. If the second photon forms part of an optical signal, i.e the second photon is a signal photon, the optical signal is, thereby, amplified by stimulated emission or, stated otherwise, by stimulated Raman scattering.

Stimulated Raman scattering gives rise to an amplification of the incoming optical signal when the signal frequency is shifted from the frequency of the pump light by the Stokes frequency. The Stokes frequency is a characteristic of the fiber material and does not vary with varying pump light frequency. Due to the impact of the solid state material embedding the scattering molecules in the fiber, the gain spectrum of monochromatic pump light is continuously distributed over a wavelength spectral range of approximately 20 nm. In other words: The phenomenon that light of a frequency f propagating in a material generates light of the frequency f+/−delta_f is called Raman effect. The light of frequency f−delta_f is called Stokes light, and the light of frequency f+delta_f is called anti-Stokes light. An optical direct amplification is carried out by using the stimulated Raman scattering phenomenon which is a non-linear effect of an optical fiber.

Among the different available pump light sources are semi-conductor laser diodes. These laser diodes generally show a spectral emission characteristic that is broad due to specific semi-conductor properties. In terms of wavelengths, the value of 30 nm represents a typical curve bandwidth.

For this type of pump light sources, lasing at a specific optical frequency can be achieved by adding a Fiber Bragg Grating (FBG) to the source, for instance in the pigtail fiber of the chip. The use of a Fiber Bragg Grating allows easy selection of a narrow optical frequency range emitted by the pump diode and stabilizes emitted optical power. Utilizing Fiber Bragg Gratings for wavelength selection is per se known. In a simplified depiction, a Fiber Bragg Grating may considered as a periodic structure of refractive index variations in a light guiding portion of the optical fiber that can reflect light of a certain wavelength propagating along the fiber. The periodic structures may be generated by exposing a doped fiber to structured ultraviolet radiation. The reflected light propagates in the fiber in a direction opposite to that of the incident light. If a diode laser is pigtailed to a fiber containing a Fiber Bragg grating, and if the centre of the grating bandwidth is within the gain bandwidth of the laser, then the optical spectrum of the diode laser will be affected. Pump light waves of a certain wavelength are reflected at a plurality of refractive index variations that are spaced apart by half the wavelength. The reflected waves interfere constructively and result in a respective intensity peak at the particular wavelength. The Intensity peak's bandwidth is much smaller than the original emission curve of the laser diode. Accordingly, a Fiber Bragg Grating represents a wavelength selective reflector.

Since the Raman amplifier is illuminated by this pump, a large part of the incident pump light energy is concentrated on the spectral bandwidth of the Fiber Bragg Grating output.

As a consequence, the output of the Raman amplifier is also concentrated on a limited bandwidth, usually to a 1-dB bandwidth of approximately 40 nm.

It is, however, desirable to have a broader signal bandwidth of Raman amplifier output in order to be able to amplify a broader bandwidth of optical signals.

To achieve a broader bandwidth, the above mentioned U.S. Pat. No. 6,384,962 discloses the utilization of multiple pumps, i.e. at least a first pump and a second pump, the first and the second pumps producing gain curves with respective maxima and minima, wherein the maximum of the second pump related curve coincides with a minimum of the first pump one. In this way, an uneven composite gain signal (gain ripple) is said to be equalized. However, due to the nature of adding independently generated gain curves, the resulting gain curve is still prone to show gain ripple. The equalization actually achieved is a function of the number of pumps. The more gain curves are superposed, the better equalization is achieved. In other words: According to U.S. Pat. No. 6,384,962, at least two independently generated gain curves are superposed, however, without major constructive interaction in the process of generating both gain curves.

SUMMARY OF THE INVENTION

It is in view of the above prior art an objective of the present invention to provide for a broadened gain curve of a Raman amplification that is not prone to show gain ripple while providing an improved Amplified Stimulated Emission (ASE) noise performance.

According to the invention, this objective is achieved by a Raman amplifier as mentioned at the outset, wherein said first optical frequency is selected to be spaced apart from a local maximum in optical power of said remaining optical frequencies, and wherein said second pump laser module emits at an optical frequency one Stokes-frequency above the frequency of said local maximum.

Further, this objective is achieved by a method as mentioned at the outset, the method comprising the steps of selecting said first optical frequency to be spaced apart from a local maximum in optical power of said remaining optical frequencies, said second pump laser module emitting at an optical frequency one Stokes-frequency above the frequency of said local maximum.

According to the invention, second order pumping is achieved for the signal. Second order pumping is a well known mean to achieve better signal gain distribution along the fiber length, thus reducing ASE noise accumulation. Both said first optical frequency and said local maximum in optical power of said remaining frequencies will provide Raman gain in the signal frequency range and will, therefore, broaden the signal gain curve. The second order pumping is achieved by said second pump laser module. Since the second pump laser module emits at an optical frequency one Stokes-frequency above the local maximum of the first pumping module, the respective optical power provided by the first pumping module will be further amplified preferentially by the second pumping module along the fiber. As an advantage, similar optical powers will be achieved at the first optical frequency that is spaced apart from the local maximum in optical power of the remaining optical frequencies and the local maximum, respectively. This similar optical powers of the first optical frequency and the frequency at the local maximum will in turn provide Raman amplification to the signal frequency range due to the Raman effect along the fiber. As a result, the gain curve of the Raman amplifier is broadened evenly.

It is preferred that said first pump laser module comprises at least one semi-conductor laser diode.

Semi conductor laser diodes provide the broad emission curve that is exploited in the present invention due to their inherent physical properties while incurring neither additional expense nor additional power consumption.

It is further preferred that said at least one semi-conductor laser diode has an emission gain curve with a broadness in the range of 20 to 40 nm.

It has been shown that such semiconductor laser diodes are well suited for a realization of the invention.

Further, it is preferred that said at least one first pump laser module represents a depolarized pump source.

If the pump and the signal were co-polarized, gain would be large whereas the gain would be small, if the pump and the signal were orthogonal to each other. Such an unwanted polarization sensitivity may be avoided by utilizing a depolarised pump.

It is further preferred that the at least one first pump laser module comprises a couple of semi-conductor laser diodes that are polarization multiplexed.

Polarization multiplexing provides for the desired result of a depolarized pump source.

Further preferred is a Raman amplifier comprising a Fiber Bragg Grating as said frequency discriminator.

A Fiber Bragg Grating has been shown to provide for easy selection of the optical frequencies emitted by the pump laser diode and to provide for stable emitted optical power. It has to be pointed out, that the use of a semiconductor laser diode without a Fiber Bragg Grating, for instance a Fabry-Perot diode, does not provide a stable broadened Raman gain curve.

A further preferred Raman amplifier utilizes a Fiber Bragg Grating design that selects an optical frequency at a low optical frequency trailing edge of the gain curve of said semiconductor laser diode.

This feature provides for a decoupling of the optical frequency to be emitted by the first pump laser module with an optical power exceeding an optical power of remaining optical frequencies and a local maximum of the remaining optical frequencies. Accordingly, two maxima of different height are generated, thereby providing a suitable basis for the additional second order amplification that leads to the above mentioned advantages.

It is further preferred, that said Fiber Bragg Grating selects an optical frequency corresponding to a wavelength being 10 to 20 nm longer than the wavelength corresponding to the optical frequency of said local maximum in optical power of said remaining optical frequencies.

Is has been shown that wavelengths from this range facilitate achieving the desired advantages outlined above.

It is further preferred that the Raman amplifier features a Raman laser as said second pump laser module. Raman lasers can provide high depolarised optical power.

In particular a high power Raman laser may be utilized. Accordingly, the amplification can be unevenly distributed between the first order provided by the semi-conductor laser diode and the second order provided by the Raman laser. As a result a further degree of freedom in the design of respective Raman amplifiers is achieved.

The invention can be applied to both lumped and distributed Raman amplifiers.

First order pump light can be either co-propagative with the signal or contra-propagative. Second order pump light can be either co-propagative with the signal or contra-propagative. It is preferred that pump light of both the first and the second order is contra-propagative with regard to the signal in order to reduce the transfer of pump light intensity fluctuations to the signal.

Further advantages can be taken from the description and the enclosed drawings.

It is to be understood that the features mentioned above and those yet to be explained below can be used not only in the respective combinations indicated, but also in other combinations or in isolation, without leaving the scope of the present invention.

BRIEF DESCRIPTION OF THE DRAWINGS

Embodiments of the invention are shown in the drawings and will be explained in more detail in the description below. In the drawings:

In FIG. 1, a pump module 10 is coupled to a Raman amplifying fiber 12 by a coupler 14, e.g. wavelength-division-multiplexer 14. An input signal enters the depicted fiber 12 on the left. The amplified signal leaves the fiber 12 at the right. Pump module 10 comprises a first pump laser module 16 and a second pump laser module 18. Both pump laser modules 16, 18 may inject into a coupler line segment 20 that is coupled to coupler 14. The first pump laser module 16 comprises at least a laser diode 22 and a frequency discriminator 24, preferably a Fiber Bragg Grating. Instead of a single laser diode 22, an array of laser diodes 22 may be utilised. Pump laser module 18 may comprise a high-power Raman laser.

A semi-conductor laser diode 22 shows, in general, a broad emission curve of optical power output versus frequency. The value of 4 THz (30 nm) represents a typical curve broadness of a semi-conductor laser diode 22. For utilization of laser diodes 22 a pump source, lasing at a specific optical frequency is usually achieved by adding a Fiber Bragg Grating to the pigtail fiber of the chip. The Fiber Bragg Grating 24 serves as a frequency discriminator for selecting an optical frequency to be emitted.

Figures 2, 3:
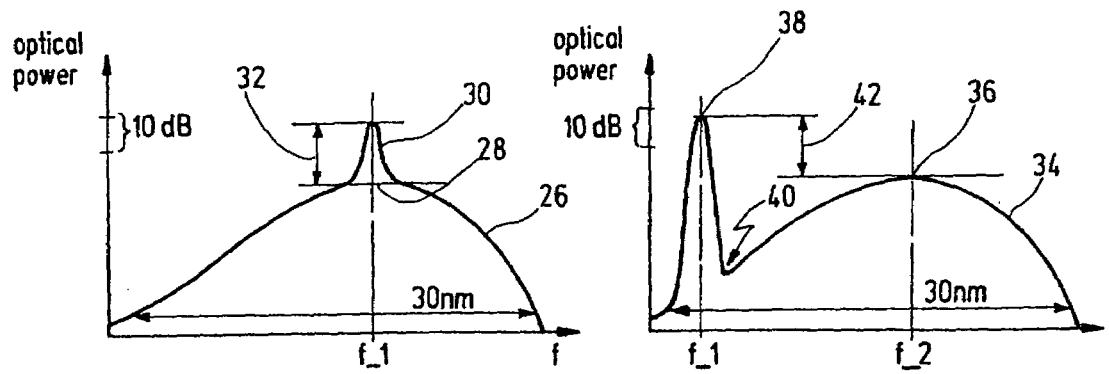
FIG. 2 shows a first emission gain curve of a semiconductor laser diode shaped by a frequency discriminator.
FIG. 3 shows an emission gain curve of a semiconductor laser diode shaped by a frequency discriminator for selecting an optical frequency to be emitted having a particular relationship to the remaining gain spectrum.

FIG. 2 shows the emission gain curve of a semi-conductor laser diode 22 in terms of output optical power versus frequency as shaped by a Fiber Bragg Grating. The use of the Fiber Bragg Grating allows easy selection of the optical frequency emitted by the pump diode and stabilizes the emitted optical power. Usually, the Fiber Bragg Grating 24 is designed to select the frequency of a global or local maximum 28 of the emission gain curve 26. Peak 30 in FIG. 2 corresponds to an optical frequency f_1 selected by a Fiber Bragg Grating 24. The optical power remaining in the emission gain curve 26 of the semi-conductor diode 22 is typically 10 to 20 dB less than the optical power available at the Fiber Bragg Grating optical frequency f_1. This characteristic is usually called side-mode suppression ratio (SMSR). Arrow 32 in FIG. 2 refers to the side-mode suppression ratio of gain curve 26.

According to the invention, the first optical frequency that is selected by the frequency discriminator is selected to be spaced apart from the local or global maximum of gain curve 26. Curve 34 in FIG. 3 represents a resulting emission gain curve. In FIG. 3, the first optical frequency f_1 is selected to be spaced apart from the frequency f_2 of a local maximum 36 in optical power of the remaining optical frequencies. In particular, peak 38 in output optical power corresponds to the first optical frequency f_1 and is positioned at the low optical frequency trailing edge 40 of the semi-conductor gain curve 34 to result in the optical spectrum shown in FIG. 3. Accordingly, in terms of wavelengths, peak 38 corresponds to wavelengths that are around 15 nm shorter than the wavelength corresponding to the frequency f_2 of the maximum 36 in curve 34.

Preferably, a couple of polarization multiplexed pump diodes 22 is utilized. Accordingly, the polarization sensitivity of the gain curve is eliminated or at least minimized.

The Fiber Bragg Grating frequency and the frequency of maximum power of the remaining optical frequencies of the semi-conductor gain curve are f_1 and f_2, respectively.

Figure 4:
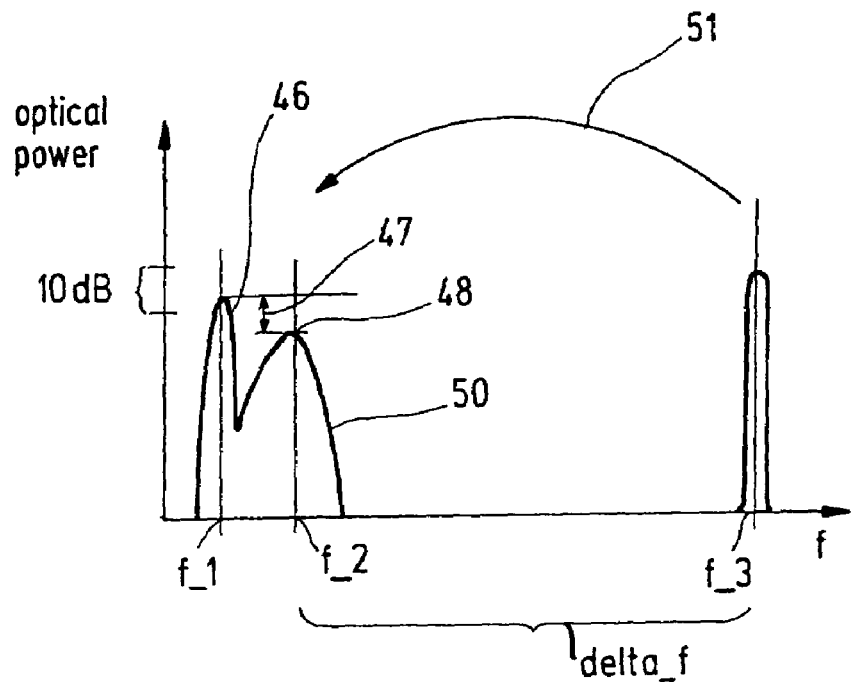
FIG. 4 represents an energy transfer from light emitted by a second pump source to light emitted by a first pump source, and FIG. 5 discloses the broadening effect achieved by the invention by showing a relative optical power versus wavelength of the signal amplified by a typical pump diode and a pump laser module in accordance with the invention.

FIG. 4 represents an energy transfer from light emitted by a second pump source to light emitted by a first pump source. The second pump source may be the second pump laser module 18 of FIG. 1. The high power Raman laser may be utilized at the second pump laser module 18. The optical frequency f_3 of the second pump laser module 18 is selected to be one Stokes frequency delta_f above the frequency f_2 of the maximum 36 of the spectrum emitted by the first pump laser module 16. Since the light from the second pump laser module 18 is injected into the same Raman amplifying fiber 12 as light from the first pump laser module 16, the pump light emitted by the first pump laser module 16 may be amplified by pump light emitted from the second pump laser module 18. It is, in particular, the optical power at the frequency f_2 that will be Raman amplified by the f_3 pump power. The optical power at f_1 will also be amplified by f_3, however, at a less extent.

As a result, energy from the second pump laser module 18 is preferably transferred to the local maximum 36 of gain curve 34 of the first pump laser module 16 as indicated by arrow 51. Accordingly, similar optical power will be achieved at both frequencies f_1 and f_2. Accordingly, the side mode suppression ratio 44, i.e. the difference in height between the maxima of 46 (corresponding to f_1) and 48 (corresponding to f_2) in gain curve 48 is reduced due to the influence of the second pump laser module 18.

Figure 1:
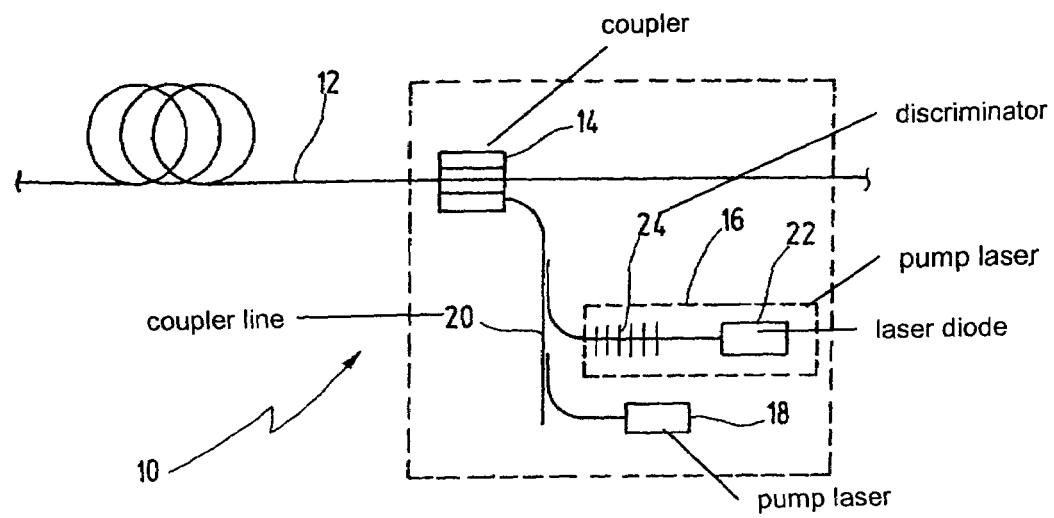
FIG. 1 shows a Raman amplifier in accordance with the present invention.

As a result the Raman amplifying fiber 12 of FIG. 1 is not only pumped with a single pump light peak at f_1, as is shown in FIG. 2, but is pumped with a broadened double peak as is shown in FIG. 4.

As a consequence, the Raman gain provided in Raman amplifying fiber 12 to the signal is also broadened. In other words, optical power available at f_1 and f_2 will both efficiently provide Raman gain in the Raman amplifying fiber 12 at wavelengths corresponding to optical frequency ranges located at f_1–delta_f and f_2–delta_f. Accordingly, a broadened signal gain curve is produced in the f_1–delta_f and the f_2–delta_f frequency range where the signal frequencies are located.

Figure 5:
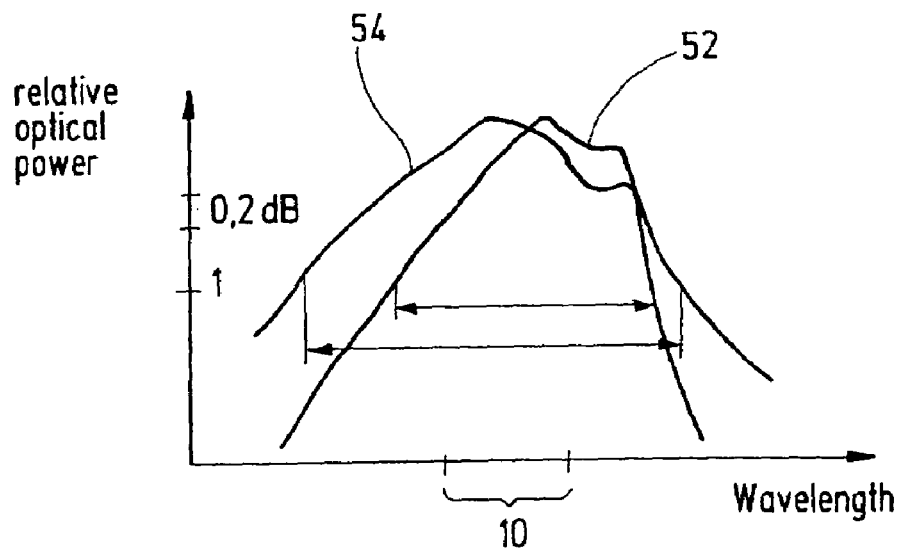

FIG. 5 shows two gain curves 52 and 54 in terms of relative optical power versus wavelength. Relative optical power is understood as the signal power at a given wavelength at the output of the Raman amplifier, divided by the maximum signal power at the output of the amplifier over the signal wavelength range for each configuration. Narrow peak curve 52 is obtained by pumping a Raman amplifying fiber 12 with a pump light spectrum corresponding to FIG. 2. Gain curve 54, on the other hand, is obtained by pumping a Raman amplifying fiber 12 with a pump light spectrum corresponding to the pump light spectrum of FIG. 4. It has been shown, that the one-dB gain curve band width of gain curve 54 may be broadened by a factor of approximately 1.5. In other words, with the shifted wave length pump laser disclosed herein, a one-dB gain curve band width of 60 nm can be achieved in comparison to a gain curve band width of around 40 nm that can be achieved with a perfectly centred wavelength pump laser.

The invention claimed is:

1. A Raman amplifier comprising at least one length of fiber, in which an optical signal propagates, and at least a coupler for coupling at least a first pump laser module and a second pump laser module to said Raman amplifying fiber,
   the first pump laser module comprising a frequency discriminator for selecting an optical frequency to be emitted with an optical power exceeding an optical power of remaining optical frequencies that are also emitted by said first pump laser module, said first optical frequency being selected to be spaced apart from a local maximum in optical power of said remaining optical frequencies, said optical frequencies being on Stokes-frequency above the signal frequency range, and said second pump laser module emitting at an optical frequency one Stokes-frequency apart from the frequency of said local maximum.

2. The Raman amplifier of claim 1, wherein said first pump laser module comprises at least one semi-conductor laser diode.

3. The Raman amplifier of claim 2, wherein said at least one semi-conductor laser diode has an emission gain curve with a breadth in the range of 20 to 40 nm.

4. The Raman amplifier of claim 1, wherein said at least one first pump laser module represents a depolarized pump source.

5. The Raman amplifier of claim 1, wherein the at least one first pump laser module comprises a couple of semiconductor laser diodes that are polarization multiplexed.

6. The Raman amplifier of claim 1, wherein said frequency discriminator comprise a Fiber Bragg Grating.

7. The Raman amplifier of claim 2, wherein said frequency discriminator comprises a Fiber Bragg Grating, and wherein said Fiber Bragg Grating selects an optical frequency at a low optical frequency trailing edge of a gain curve of said semiconductor laser diode.

8. The Raman amplifier of claim 7, wherein said Fiber Bragg Grating selects an optical frequency corresponding to a wavelength being 10 to 20 nm longer than the wavelength corresponding to the optical frequency of said local maximum in optical power of said remaining optical frequencies.

9. The Raman amplifier of claim 1, wherein said second pump laser module is a Raman laser.

10. A method for pumping a Raman amplifier, the method comprising the steps of:

providing at least one length of Raman amplifying fiber, coupling at least a first pump laser module and a second pump laser module to said Raman amplifying fiber, and selecting an optical frequency to be emitted by the first pump laser module with an optical power exceeding an optical power of remaining optical frequencies that are also emitted by said first pump laser module, wherein said first optical frequency is selected to be spaced apart from a local maximum in optical power of said remaining optical frequencies, said optical frequencies being one Stokes frequency above the signal frequency range, said second pump laser module emitting at an optical frequency one Stokes-frequency apart from the frequency of said local maximum.

* * * * *